United States Patent [19]

Chou

[11] Patent Number: 4,972,418

[45] Date of Patent: Nov. 20, 1990

[54] MEMORY READBACK CHECK APPARATUS

[75] Inventor: Fujio Chou, Tokyo, Japan

[73] Assignee: NEC Corporation, Tokyo, Japan

[21] Appl. No.: 234,985

[22] Filed: Aug. 22, 1988

[30] Foreign Application Priority Data

Aug. 20, 1987 [JP] Japan .................................. 62-205084

[51] Int. Cl.⁵ ........................ G06F 11/32; G06F 11/00
[52] U.S. Cl. ................................... 371/21.2; 371/21.5; 371/21.3
[58] Field of Search ....................... 371/15.1, 13, 21.1, 371/21.3, 21.5, 67.1, 68.1

[56] References Cited

U.S. PATENT DOCUMENTS

| | | | |
|---|---|---|---|
| 4,355,390 | 10/1982 | Hollwig | 371/21.5 |
| 4,661,930 | 4/1987 | Tran | 371/21.3 |
| 4,726,024 | 2/1988 | Guziak | 371/21.2 |
| 4,744,058 | 5/1988 | Kawachima | 371/21.3 |
| 4,782,486 | 11/1988 | Lipcon | 371/21.2 |
| 4,788,684 | 11/1988 | Kawaguchi | 371/21.2 |
| 4,807,186 | 2/1989 | Olnishi | 371/21.5 |

Primary Examiner—Michael R. Fleming
Attorney, Agent, or Firm—Sughrue, Mion, Zinn, Macpeak & Seas

[57] ABSTRACT

A memory check circuit for a memory system using a plurality of memories whose write addresses and read addresses are automatically updated in response to a data write and read clock pulse, includes a selector coupled to the plurality of memories for inserting a unique word for data error detection into a data sequence at predetermined interval and for providing a unique word-inserted data sequence, and a write clock pulse supplying device for supplying the write clock pulse to each of the plurality of memories while a read clock pulse supplying device supplies the read clock pulse to each of the plurality of memories. A unique word detection device detects the unique word from data read out from the plurality of memories in response to the read clock pulse and generates a detection signal. A timer counts a predetermined period of time and generates a reset signal to reset the plurality of memories if the detection signal is not generated within the predetermined time period.

4 Claims, 2 Drawing Sheets

FIG. 2

FIG. 2a  FIFO11 (1~4bit) OUTPUT
FIG. 2b  FIFO12 (5~8bit) OUTPUT
FIG. 2c  FIFO13 (9~12 bit) OUTPUT
FIG. 2d  FIFO14 (13~16 bit) OUTPUT
FIG. 2e  CONTENTS OF COUNTER10
FIG. 2f  READ CLOCK
FIG. 2g  CLOCK GENERATOR 7 ENABLE
FIG. 2h  NOR GATE 9 OUTPUT
FIG. 2i  DIFFERENTIAL CIRCUIT 15 OUTPUT

MEMORY READBACK CHECK APPARATUS

BACKGROUND OF THE INVENTION

The present invention relates to a circuit for detection of any position difference of output data due to erroneous data written into a memory.

Along with the development of data processing systems, the memories used therein have tremendously grown in capacity. In this connection, there have been proposed various error checking apparatuses intended to increase the reliability of memories. Known such error checking apparatus include the error correction and detection circuit described in U.S. Pat. No. 4,296,494, which uses an error correcting code such as the Hamming code, and the memory readback check apparatus, described in U.S. Pat. No. 4,363,125, which compares data having come through the memory and the original data. These prior art apparatus are applicable to random-access memories which require addressing and therefore have terminals for address inputting and address updating (increment). The errors in this type of memory are generally limited to bit inversions in data due to a memory cell failure or some other external factor such as noise. This is because the noise induces to take in the data into the same location of the memory unless the address is updated or a new address is given.

On the other hand, some sequential-access memories need no such addressing. For instance TMS4C1050NL, supplied by Texas Instruments Inc., dispenses with such addressing by the combined use of each write clock pulse and each read clock pulse with an address updating clock pulse. As the write or read address in this kind of memory is updated every time data are written or read, there arises the problem that, once noise or any such external factor works on some, but not all, of a plurality of memory blocks connected in parallel in a memory system, data positions in the affected memory blocks are different from the corresponding data positions in the other memory blocks. No remedy, however, has been taken again such position difference of data in memory blocks.

SUMMARY OF THE INVENTION

An object of the present invention, therefore, is to provide a memory check apparatus capable of detecting such position difference of data in memory blocks as described above.

According to the invention, a memory check apparatus comprises a memory check circuit for a memory system using a plurality of memories whose write addresses and read addresses are updated in response to a data write clock pulse, and a data read clock pulse, respectively. A selector inserts a unique word for data error detection into input data at predetermined intervals. A write clock pulse generator supplies the write clock pulse to each of the plural memories, while a read clock pulse generator supplies the read clock pulse to each of the plural memories. A unique word detector detects the unique word from data read out of the plural memories in response to the read clock pulse and generates a detection signal. A reset circuit generates a reset signal to reset the plural memories if said detection signal is not generated within a predetermined period of time.

BRIEF DESCRIPTION OF THE DRAWINGS

The above and other objects, features and advantages of the present invention will become apparent from the following detailed description when taken with the accompanying drawings wherein:

FIGS. 2a to 2i are time charts for explaining the operation of the embodiment shown in FIG. 1.

DETAILED DESCRIPTION OF THE PREFERRED EMBODIMENT

Figure 1:
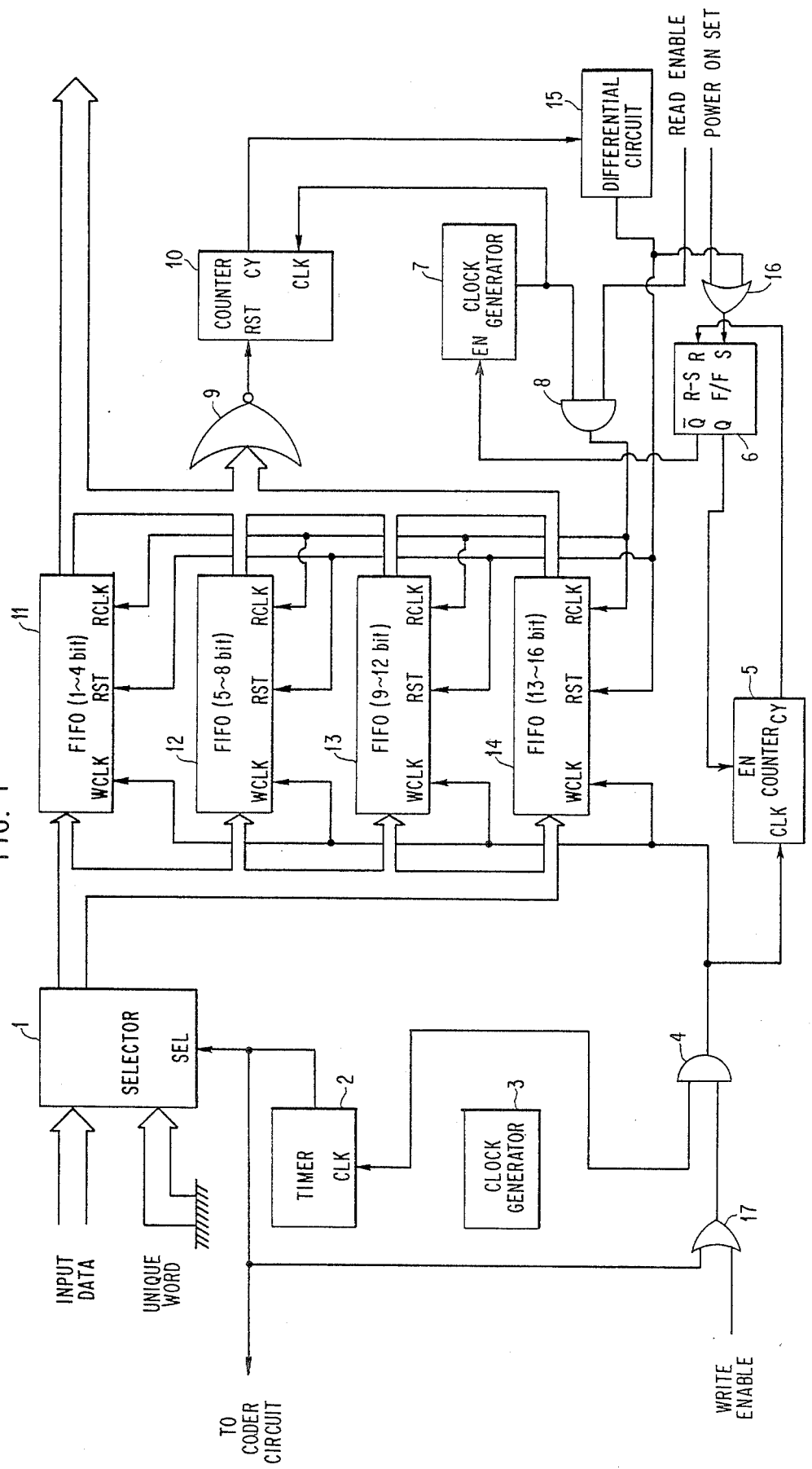
FIG. 1 is a block diagram illustrating a preferred embodiment of the invention.

FIG. 1 is a block diagram illustrating a preferred embodiment of the present invention, which is an example of application to a high-efficiency encoder for television signals and the like. As is well known, a high-efficiency encoder would produce coded data (hereinafter simply referred to as "data") in random. A selector 1 and an OR gate 17 respectively receive data from an encoder (not shown) and a write enable (WE) signal for the data. The selector 1 also receives a unique word (UW) for error detection, selects either the data or the UW according to a selection signal from a timer 2, and feeds what has been selected to first-in first-out memories (FIFO's) 11 to 14. In this embodiment, the data width or word is supposed to be 16 bits, and four FIFO's connected in parallel each of which has four-bit input/output are used to store the 16-bit parallel data. In each of the four FIFO's, its read and write enable terminals are fixed in an active state (supposed to be a high level), so that reading or writing can be performed if a read or write clock pulse alone is provided as the case may be. This reading/writing applies to an address pointed by a read/write address pointer (not shown) within each FIFO, and the updating (increment) of this address pointer is performed, as stated above, with a read or write clock pulse. The timer 2 counts a predetermined number of clock pulses from a first clock pulse generator (CPG) 3, and generates the aforementioned selection signal in a predetermined period. As a result, the selector 1 inserts the UW into the data at predetermined intervals. The selection signal is also given to the OR gate 17 as the WE signal for the UW, and further used as a data output stop signal for the encoder so that no data be outputted when the selector 1 selects the UW.

In this embodiment, a code of all 16 "0" bits is used as the UW since it is a code unlikely to ever emerge in the data from the encoder. The data in which the UW is inserted at predetermined intervals are written into the FIFO's 11 to 14 in response to the write clock pulse, which is generated by an AND gate 4 based on the WE signal from the OR gate 17 and a clock pulse from the first CPG 3. Data reading out of the FIFO's 11 to 14 takes place in response to the read clock pulse, which, like the aforementioned write clock pulse, is generated by an AND gate 8 based on a clock pulse from a second CPG 7 and a data read request signal or a read enable signal from an external circuit (not shown).

The data read out are outputted to the external circuit and at the same time inputted into a UW detecting circuit 9 consisting of a NOR gate. The UW detecting circuit 9 detects the UW, and gives the detection signal to the reset terminal of a second counter 10, which counts the clock pulse from the second CPG 7 and supplies a carry signal when a predetermined count is reached. The predetermined count of the counter 10 is so set as to allow a long enough time for the UW to be detected by the NOR gate 9 at least once unless the position difference of data occurs. Thus, if no UW is detected within the predetermined period of time, the counter 10 will output the carry signal. Receiving the carry signal, a differential circuit 15 generates reset signals for the FIFO's 11 to 14.

Incidentally, the counter 5, a set-reset flip-flop (R-S F/F) 6 and an OR gate 16 are provided for the purpose of controlling the start up of the apparatus and data reading at the time of resetting the FIFO's 11 to 14. Now it is supposed that the initial logical values at terminals S, R, Q and $\overline{Q}$ of the F/F 6 are "0", "0", "0" and "1", respectively. As a power-on-set signal "1" is inputted to the set terminal S of the F/F 6 via the OR gate 16 at the time of starting the circuit, the Q and $\overline{Q}$ outputs of the F/F 6 change to "1" and "0", respectively. The Q and $\overline{Q}$ outputs are connected to the enable terminals of the counter 5 and of the second CPG 7, respectively, and the counter 5 starts counting a predetermined number of write clock pulses in response to the Q output ("1"), while the second CPG 7 stops generating its clock pulse in response to the $\overline{Q}$ ("0"). When the counter 5 finishes counting the prdetermined number of pulses, or when a predetermined number of data have been accumulated in the FIFO's 11 to 14, the carry signal is supplied to the reset terminal R of the F/F 6. The F/F 6, responding to the carry signal, alters the Q and $\overline{Q}$ outputs to "0" and "1", respectively. The counter 5 stops counting in response to the Q output of "0", while the second CPG 7 starts operating in response to the $\overline{Q}$ output of "1", and generates the read clock pulse for the FIFO's 11 to 14.

Next will be further described the detection of errors in data with reference to FIGS. 2a to 2i. FIGS. 2a to 2d are representative of any one of four parallel data sequences, read out of the FIFO's 11 to 14, respectively. The three remaining sequences within the same FIFO have similar ones as indicated in FIGS. 2a to 2d corresponding to the FIFO's 11 to 14. In FIGS. 2a to 2d, the same alphabetical letter (e.g. $b_1 \sim b_4$) in column denotes input data written at the same point of time. As is evident from the charts, in a normal state, data denoted by the same letter ($b_1 \sim b_4$, $c_1 \sim c_4$ ... $h_1 \sim h_4$) are also read out at the same time. To facilitate understanding, the data in FIGS. 2a to 2d are supposed to be read out periodically.

Where no position difference of data occurs, as shown in FIG. 2h, the UW detecting circuit 9 detects the UW (all 16-bit "0"), and resets the second counter 10 (FIG. 2e). However, if noise or some other external cause energizes the FIFO to take in input data and concurrently increments the address pointer despite no actual supply of a write clock pulse, the writing of the same data takes place in the neighboring location of the FIFO. Thus, in reading the noise-affected FIFO or FIFO's will read out a datum one time slot previous to those read out of the other FIFO's. More specifically, if noise invites erroneous writing as indicated by "x" marks in FIGS. 2b and 2c, the successive data written after that point of time on will be read out of phase with respect to properly written data of the other FIFO's. As a result, the UW will not be correctly read out either, making it impossible for the UW detecting circuit 9 to detect the UW. Meanwhile the second counter 10, as it is supplied with no detection signal from the UW detecting circuit 9, keeps on counting the clock pulse from the second CPG 7 and generates a carry signal when its count reaches a predetermined value. The differential circuit 15 generates a memory reset signal (FIG. 2i) in response to the carry signal. The F/F 6, responding to the carry signal, stops the operation of second CPG 7, and thereby discontinues the supply of the clock pulse to the counter 10 and the read clock pulse to the FIFO's 11 to 14 (FIGS. 2f and 2g).

As hitherto described, the present invention makes it possible to correct the position difference of data in a memory, which automatically updates its addresses, by inserting a UW for data error detection into input data at predetermined intervals, assuming the occurrence of position difference of data if no UW is detected within a predetermined period of time, and resetting the memory.

Although the write and read enable terminals of the memory are fixed at the active level in this preferred embodiment, it must be obvious to those skilled in the art that the write and read enable signals could as well be inputted from outside to dispense with the AND gates 4 and 8 and that the UW and the detecting means therefor are not limited to the scope of this particular embodiment either.

Moreover, the present invention can correct such errors involved in reading as take place when noise triggers to read out he data and concurrently increment the pointer.

What is claimed is:

1. A memory check circuit for a memory system using a plurality of memories whose write addresses and read addresses are automatically updated in response to a data write and read clock pulse, respectively, comprising:

means coupled to said plurality of memories for inserting a unique word for data error detection into a data sequence at predetermined intervals and for providing a unique word-inserted data sequence;

write clock pulse supplying means for supplying said write clock pulse to each of said plurality of memories;

read clock pulse supplying means for supplying said read clock pulse to each of said plurality of memories;

said plurality of memories writing said unique word-inserted data sequence in response to said write clock pulse and reading out said unique word-inserted data sequence on a first-in-first-out basis in response to said read clock pulse to output an output data sequence;

means coupled to said plurality of memories for detecting said unique word from said output data sequence and generating a detection signal; and timer means for counting a predetermined period of time and for generating a reset signal to reset said plurality of memories if said detection signal is not generated within said predetermined period of time.

2. A memory check circuit comprising:

first clock pulse generating means for generating a first clock pulse for use in data writing;

means for generating a selection signal at predetermined intervals in response to said first clock pulse;

selecting means for selecting either input data supplied from outside or a unique word for error detection according to said selection signal;

a plurality of memories connected in parallel into which the output data from said selecting means is written;

means responsive to said first clock pulse for generating a write clock pulse in response to which the output data from said selecting means is written into said plurality of memories;

second clock pulse generating means for generating a second clock pulse for use in data reading;

means responsive to said second clock pulse for generating a read clock pulse in response to which the data written into said plurality of memories are read out;

detecting means responsive to the data read out of said plurality of memories for generating a detection signal if said unique word for error detection is detected from said read-out data;

timer means for measuring a predetermined period of time and for generating an error detection signal if said detection signal is not generated within said predetermined period of time; and means for generating a reset signal for said plural memories based on said error detection signal.

3. A memory check circuit, as claimed in claim 1, further comprising control means for starting to count said write clock pulse when said reset signal is generated; suspending the operation of said read clock pulse supplying means until a predetermined count is reached; resuming the operation of said read clock pulse supplying means and at the same time suspending the counting of said write clock pulse when said predetermined count is reached.

4. A memory check circuit, as claimed in claim 2, further comprising control means for starting to count said write clock pulse when said reset signal is generated; suspending the operation of said second clock pulse generating circuit until a predetermined count is reached; resuming the operation of said second clock pulse generating circuit and at the same time suspending the counting of said write clock pulse when said predetermined count is reached.

* * * * *